(12) United States Patent
Hannoch

(10) Patent No.: US 6,723,491 B2
(45) Date of Patent: Apr. 20, 2004

(54) UTILIZING UV TO FORM AND DECOMPOSE A PRINTING MEMBER

(75) Inventor: Ron Hannoch, Kadima (IL)

(73) Assignee: KBA (Advanced Imaging Technology) (Israel) Limited, Tel Aviv (IL)

( * ) Notice: Subject to any disclaimer, the term of this patent is extended or adjusted under 35 U.S.C. 154(b) by 1 day.

(21) Appl. No.: 09/874,986

(22) Filed: Jun. 7, 2001

(65) Prior Publication Data
US 2002/0017211 A1 Feb. 14, 2002

Related U.S. Application Data
(60) Provisional application No. 60/216,368, filed on Jul. 5, 2000.

(51) Int. Cl.[7] ................................. G03F 7/09
(52) U.S. Cl. ............... 430/272.1; 430/19; 430/281.1; 430/302; 430/303; 430/348; 430/394; 430/494; 101/453; 101/465; 101/478
(58) Field of Search ................ 430/19, 270.1, 430/271.1, 272.1, 273.1, 281.1, 302, 303, 306, 307, 348, 394, 401, 432, 434, 494, 944, 945; 101/130, 453, 457, 463.1, 465, 467, 466, 478; 428/913

(56) References Cited

U.S. PATENT DOCUMENTS

| | | | | |
|---|---|---|---|---|
| 4,179,295 A | * | 12/1979 | Takamizawa et al. | 428/447 |
| 5,440,987 A | * | 8/1995 | Williams et al. | 101/454 |
| 5,700,899 A | * | 12/1997 | Aoki et al. | 528/37 |
| 5,713,287 A | * | 2/1998 | Gelbart | 101/467 |
| 5,759,721 A | * | 6/1998 | Dhal et al. | 430/1 |
| 5,855,173 A | * | 1/1999 | Chatterjee et al. | 101/453 |
| 6,298,780 B1 | * | 10/2001 | Ben-Horin et al. | 101/478 |

FOREIGN PATENT DOCUMENTS

WO WO 99/36266 * 7/1999 ............. B41C/1/10

OTHER PUBLICATIONS

D. Zhang, S.M. Dougal and M.S. Yeganeh, Effects of UV Irradiation and Plasma Treatment on a Polystyrene Surface Studied by IR–Visible Sum Frequency Generation Spectroscopy, Langmuir 2000, 16, 4528–4532.

K. Hochgeschwender, Experiments with Light–Induced Oxidative Degradation of Silicones in the Aqueous Phase, Silicones Chemistry and Technology, Vulkan–Verlag Essen, 1989, pp. 35–43.

R. Eckberg, S. Rubinsztajn, M. Krenceski, J. Hathenway, R. Griswold, Novel Radiation Curable Vinyl Ether–Epoxysilicone Compositions and Coatings, RadTech 2000, Conference Proceedings, pp. 69–86.

* cited by examiner

Primary Examiner—Mark F. Huff
Assistant Examiner—Barbara Gilliam
(74) Attorney, Agent, or Firm—Katten Muchin Zavis Rosenman

(57) ABSTRACT

In one embodiment, the present invention is directed to a method for preparing a printing member by coating a printing cylinder with a layer comprising ultraviolet-curable silicones and curing the layer using ultraviolet radiation.

15 Claims, 4 Drawing Sheets

UTILIZING UV TO FORM AND DECOMPOSE A PRINTING MEMBER

CROSS-REFERENCE TO RELATED APPLICATIONS

The present application claims priority from U.S. Provisional Application Ser. No. 60/216,368, filed Jul. 5, 2000, which is incorporated herein by reference.

BACKGROUND OF THE INVENTION

Plateless imaging is a method of generating an image directly on a printing cylinder. The coating materials, which form the plateless printing member together with the cylinder surface, are applied on-press. The coating materials are applied in a liquid state and then cured. After each printing job, the cured materials are removed and the printing cylinder is prepared for reuse, either by cleaning the priming cylinder or by replacing a reusable substrate.

The use of cross-linked poly-dimethyl siloxane (PDMS) is well known in waterless offset printing. In existing plateless printing systems, the PDMS coating is cured by heating it to a temperature of approximately 120° C. to 150° C. In order to prevent toning, the printing cylinder has to be cooled before printing to a temperature of approximately 20° C.

It would be desirable to use a coating that eliminates the need for heating the printing press.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompany drawings in which:

Figure 1:
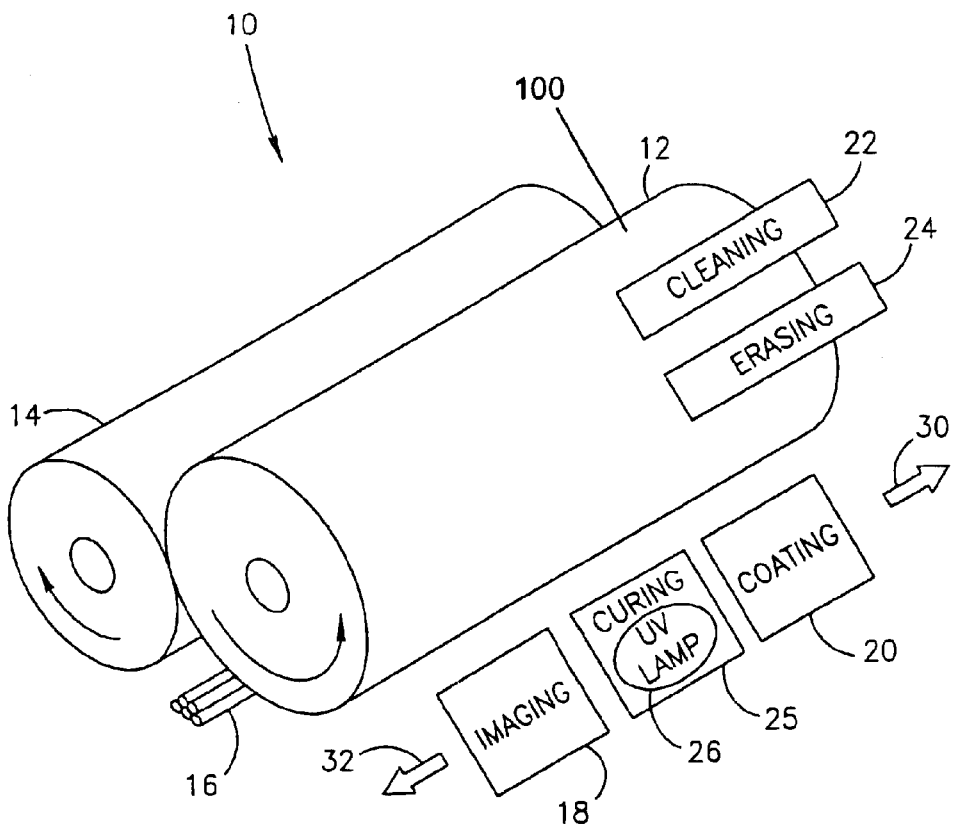
FIG. 1 is a schematic illustration of a plateless printing system according to some embodiments of the present invention.

It will be appreciated that for simplicity and clarity of illusion, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific detail are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Various embodiments of the present invention are directed to utilizing ultraviolet (UV) or visible radiation to form and decompose a printing member for waterless offset printing. In these embodiments the imaging layer may comprise UV/visible-curable silicones, which are cross-linking poly-dimethyl siloxane (PDMS) having the ability of being cured by UV or visible radiation.

In some embodiments, which will be described hereinbelow with respect to FIG. 2, a single ablatable imaging layer comprising UV-curable silicones is formed. A formulation comprising UV-curable silicones may be coated onto a printing cylinder having an ink-accepting oleophilic surface. The coated layer may be cured by UV radiation and then may be imaged by selectively ablating the cured layer, thus revealing the ink-accepting imaged areas.

In other embodiments, which will be described hereinbelow with resect to FIGS. 3 and 4, a two-coat ablatable imaging layer comprising UV-curable silicones is formed. In these embodiments, the cured bottom layer may serve as an ink-accepting agent.

In further embodiments, which will be described herein below with respect to FIG. 5, the imaging layer comprising UV/visible-curable silicones may allow direct imaging. In the direct imaging method, a suitable light source may be used to perform selective UV/visible-curing of the silicone formulation. Non-limiting examples of such a light source include a laser having a suitable wavelength and a broadband light source having a suitable filter and a spatial light modulator (SLM). The formulation may be coated onto a printing cylinder having an ink-accepting oleophilic surface. The coated layer may be selectively cured in the non-imaged areas. The uncured formulation may then be removed exposing the ink-accepting imaged areas.

Reference is now made to FIG. 1, which is a schematic illustration of a plateless printing system 10 according to some embodiments of the present invention. Printing system 10 may comprise a printing cylinder 12, a blanket cylinder 14, an inking system 16 and an imaging system 18.

Printing cylinder 12 may have an imaging layer, generally designated 100, directly coated onto cylinder 12. Alternatively, printing cylinder 12 may carry a replaceable substrate (not shown), either as a sleeve or as a sheet, that may be replaced after a large number of jobs. This has the advantage of protecting the cylinder from wear.

Printing system 10 may further comprise a coating system 20, a cleaning system 22 adapted to clean printing cylinder 12 after imaging and an erasing system 24 adapted to remove the ink leftover and the imaged layer after the printing impressions have been made. Coating system 20, cleaning system 22 and erasing system 24 may be any suitable system using any suitable process for coating, cleaning, and erasing, respectively.

Printing system 10 may comprise an UV curing system 25 having at least one UV lamp 26, UV lamp 26 may be adapted to move parallel to the longitudinal axis of cylinder 12 as it rotates, as indicated by arrows 30 and 32. Alternatively, the length of UV lamp 26 may be approximately the length of cylinder 12.

Printing cylinder 12 may comprise an oleophilic surface from a material that is suitable for receiving and adhesion of the oleophobic coating layer 100. Non-limiting examples of such a surface include plastics, reinforced plastics, metals such as aluminum (or anodized aluminum) and copper, ceramics and stones, such as granite.

Imaging layer 100 may comprise UV/visible-curable silicones such as UV 9500 of GE Bayer silicones, the Netherlands and SILCOLEASE UV POLY 200 of Rhodia Silicones, Lion, France. It has been found that in order to obtain good coating for a variety of substrates together with good adhesion to said substrates and good release properties of the layer formed and good scratch resistance, the following components of the coating may be present in the following parts by weight:

| UV-curable silicone | ~50%–90% |
|---|---|
| Photo-initiator | ~1%–10% |
| Photo-sensitizer | ~1%–10% |
| Infrared absorber | ~1%–20% |

Vinyl ether such as those manufactured by BASF, Germany by ISP, USA or by Morflex Inc. NC, USA may be added to the formulation described hereinabove. The properties of the coating formulation may be modified by vinyl ether monomers. The addition of vinyl ether to the above formulation may increase the adhesion of the layer to the surface, may reduce the viscosity of the formulation, and may improve flow properties. Additionally, the incorporation of infrared (IR) absorbing materials, such as carbon black may be easier in a mixture comprising vinyl ethers.

Figure 2:
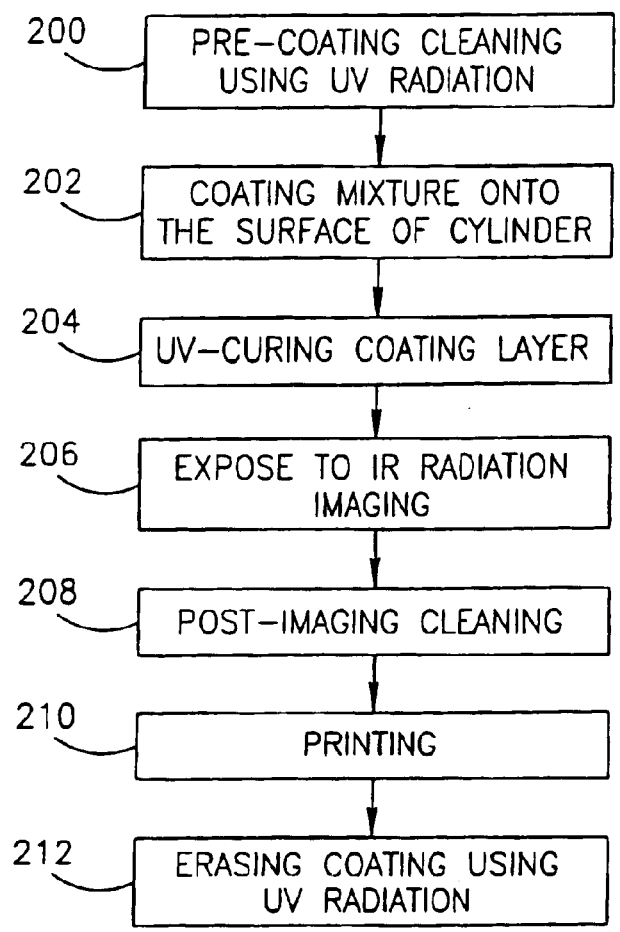
FIG. 2 is a flow chart diagram of the operation of the system of FIG. 1 according to some embodiments of the present invention.

Reference is now made to FIG. 2, which is a flow chart diagram of the operation of system 10 according to some embodiments of the present invention. Optionally, prior to coating, printing cylinder 12 may be irradiated using UV lamp 26 in order to clean its surface (step 200). The UV radiation of the space prior to coating may increase the adhesion of coating layer 100 to printing cylinder 12. Short UV radiation (either UVB or UVC) may activate certain surfaces by the oxidation of polymers having carbonyl and/or carboxyl groups, which are attached to the surface. As a result, the surface energy may be increased and the adhesion of the coating to the surface may be improved.

UV-curable silicones may have a long shelf life and/or pot life compared to other curable silicones used in existing printing systems. Therefore, the mixture for coating may be prepared off-press. The mixture may then be coated onto the surface of printing cylinder 12 using coating system 20 (step 202).

Next, UV lamp 26 may be turned on and may traverse the cylindrical surface as it rotates to allow the curing of layer 100 (step 204). Compared to other curing methods (e.g. heat energy), the use of UV and visible radiation for curing may be more efficient. The radiation may be directly focused on the surface with only relatively minor losses to the ambience. Additionally, UV lamps 26 may be turned on and off instantaneously and the duration of radiation may be shorter.

Imaging system 18 may then selectively expose the imaging layer during multiple rotations of printing cylinder 12 (step 206). During further rotations of cylinder 12, cleaning system 22 may be operated (step 208). At this stage, system 10 is ready to print and the appropriate ink may be applied to printing cylinder 12 by inking system 16. Printing cylinder 12 may be cooled if necessary to control the temperature of the ink during printing, for example in waterless printing. After the required number of impressions have been printed (step 210), the remainders of layer 100 and ink may be removed by erasing system 22 (step 212).

It is known that in the presence of UV radiation and nitrate ($NO_3$) ions may decompose PDMS. In order to facilitate the post-printing cleaning, an aqueous solution comprising $NO_3^-$ ions may be applied to the remainders of layer 100. UV lamp 26 may be turned on and cylinder 12 may be irradiated as it rotates to allow the decomposition of the cured layer 100.

Figure 3:
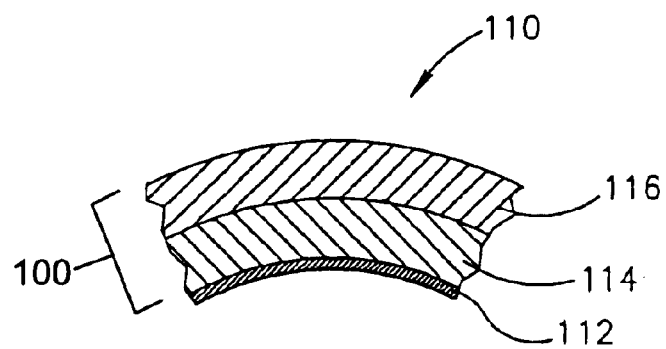
FIG. 3 is a cross-sectional schematic illustration of a two-coat printing member according to some embodiments of the present invention.

Reference is now made to FIG. 3, which is a cross-sectional schematic illustration of a two-coat imaging layer coated on a metal cylinder surface according to some embodiments of the present invention. Printing member 110 may comprise a metal surface 112, a first ink-accepting and heat-isolation layer 114, and a top IR ablateable oleophobic layer 116.

First layer 114 may be of thickness between approximately 10–50 μm and may comprise a radiation-curable resin or a heat-curable resin. Layer 114 may comprise UV-curable acrylates with a low resistance to aqueous solutions. Non-limiting examples of such acrylates include polyether acrylate, polyethylene glycol based acrylates and acrylates with high acid value.

After curing, first layer 114 may be able to serve as an ink-accepting agent and as an isolating material for the IR imaging laser. It may eliminate the need for a polyester film and a clamping system to mount the film onto the cylinder. As a result, printing cylinder 12 may become a seamless cylinder having a printing member around its entire surface.

First layer 114 way be at least partially water-soluble or water sensitive and may be easily removed. Since no water is present during the waterless print process, layer 114 may be removed in an easy and controlled manner. Top IR ablateable oleophobic layer 116 may be applied on top of cured layer 114 and may comprise the UV-curable silicone formulation described hereinabove in relation to FIG. 2.

Figure 4:
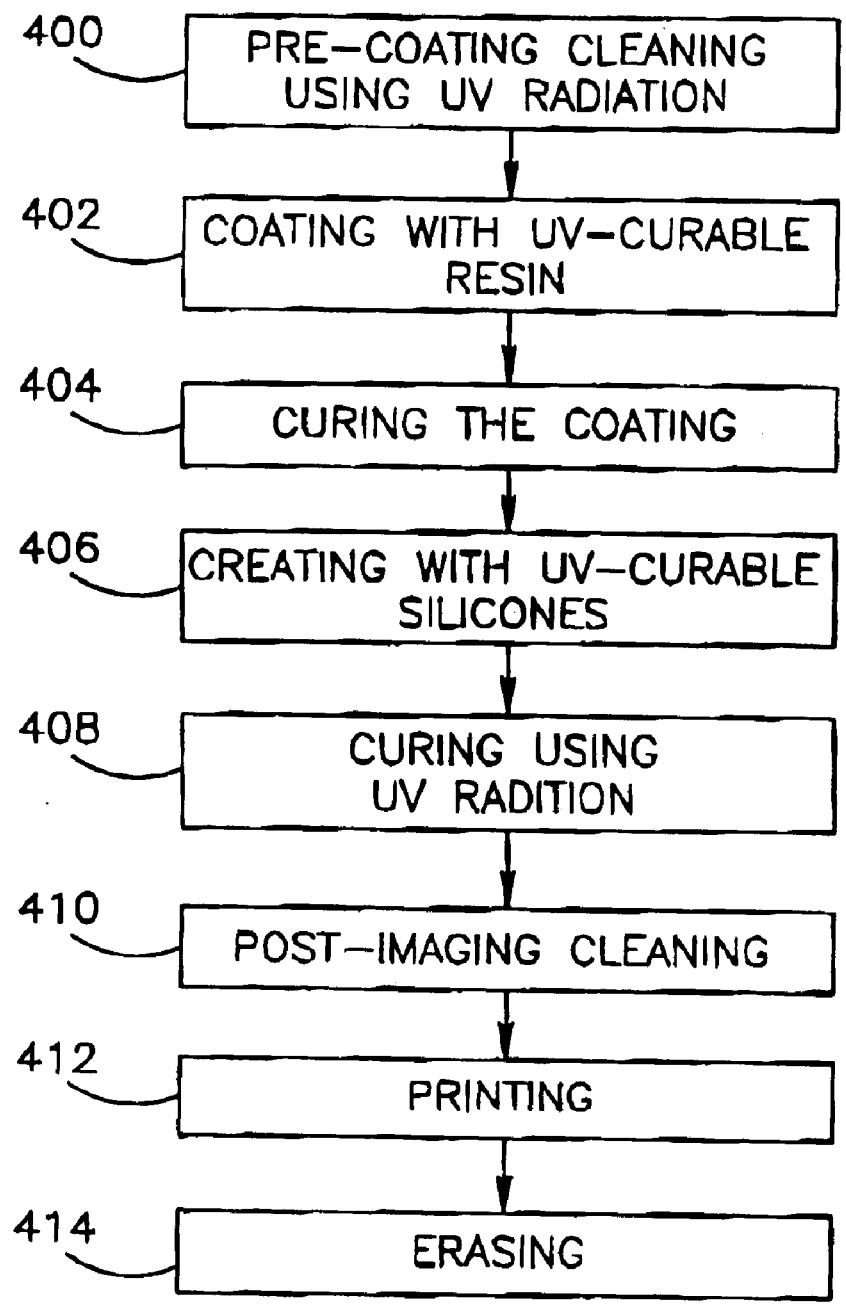
FIG. 4 is a flow chart diagram of the operation of the system of FIG. 1 according to some embodiments of the present invention.

Reference is now made to FIG. 4, which is a flow chart diagram of the operation of system 10 when applying the two-coat imaging layer on the printing cylinder according to some embodiments of the present invention. Optionally, prior to coatings printing cylinder 12 may be radiated using UV lamp 26 for cleaning purposes (step 400). Then a formulation comprising curable resin may be applied to the surface of cylinder 12 forming first layer 114 (step 402). First layer 114 may then be cured using UV lamp 26 (step 404). It should be noted that other curing methods like heat might be suitable for curing first layer 114.

A second formulation comprising UV-curable silicones is then applied on top of layer 114 to form top layer 116 (step 406). Top layer 116 may be cured using UV lamp 26 (step 408). Imaging system 18 may then selectively expose the imaging layer during multiple rotations of printing cylinder 12 (step 408). During further rotation of cylinder 12, cleaning system 22 may be operated (step 410). At this stage, system 10 is ready to print and the appropriate ink may be applied to printing cylinder 12 by inking system 16. After the required number of impressions have been printed (step 412), the remainders of layer 100 and ink may be removed by erasing system 22 (step 414).

It should be noted that some of the processes described hereinabove might be performed concurrently. For example, removing the remainders of the printed layer (step 414) and clog the cylinder with UV radiation before coating it for another printing job. Another example may be coating the cylinder while curing the coat layer. It should be noted that also more than two processes might be performed concurrently.

Figure 5:
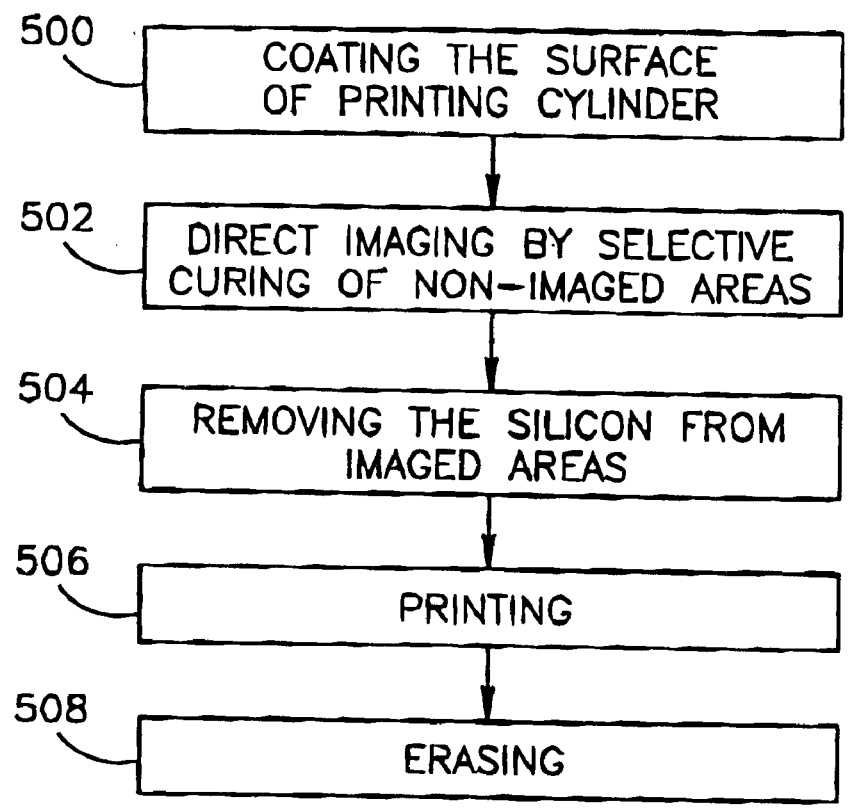
FIG. 5 is a flow chart diagram of the operation of the system of FIG. 1 according to some embodiments of the present invention.

Reference is now made to FIG. 5, which is a flow chart diagram of a direct imaging operation of system 10 according to some embodiments of the present invention. The term direct imaging refers to selective hardening of the non-imaged area of the imaging layer. In the method of ablation imaging described previously in relation to FIG. 2, the entire coating layer coated onto an ink-accepting substrate is first cured and then imaged by ablating, thus exposing the ink-accepting areas.

In contrast, in the method of direct imaging, only the non-imaged areas are selectively cured by radiation from a suitable light source, which emits in the visible or UV region. Non-limiting examples of a suitable light source include a laser having a suitable wavelength and a broadband light source having a suitable filter and an SLM. The imaging layer may be coated onto a printing cylinder having an ink-accepting oleophilic surface. After selectively curing the imaging layer to form the non-imaged areas, the ink-accepting imaged areas are exposed by removing the uncured formulation and exposing the cylinder. In these embodiments, the imaging system and the curing system are integrated, eliminating the need for two distinct units and speeding up the process of printing.

In the direct image process, printing cylinder 12 may be coated by a formulation comprising suitable photo-sensitizers and/or photo-initiators (step 500). Example II, which is given below, describes a non-limiting example of such a formulation. The formulation may be applied directly onto the metal surface of cylinder 12, which may serve as the ink-accepting agent. Unlike the method of IR ablation, there is no need for thermal isolation achieved by a polyester film, therefore the printing member is mounted seamlessly on cylinder 12.

The non-image areas may be cured and imaged by a suitable radiation source (step 502). The uncured silicone, which is in a liquid state, is then removed (step 504). It should be noted that to remove the uncured silicone in this process is much easier than to remove the cured silicone in the ablation process. At this stage, system 10 is ready to print and the appropriate ink may be applied to printing cylinder 12 by inking system 16. After the required number of impressions have been printed (step 506), the remainders of layer 100 and ink may be removed (step 508).

The following examples are now given, though by way of illustration only, to show certain aspects of some formulations according to some embodiments of the present invention without limiting its scope.

EXAMPLE I

Top Ablatable Layer

This is an example illustrating the preparation of the formulation for a top IR ablatable layer. The following formulation was prepared as a mixture (all numbers designating parts in the formulation are in parts by weight of the entire formulation).

| | |
|---|---|
| UV9400 (GE Bayer Silicones, the Netherlands) | 76 |
| SILCOLEASE UV (Rhodia, Lion, France) RCA 200 | 5 |
| SILQUEST A-186 (Witco, USA) | 10 |
| UV9380C (GE Bayer Silicones, the Netherlands) | 2 |
| DAROCUR 1173 (Ciba-geigy, Switzerland) | 1 |
| SPEEDCURE-ITX (Lambson Limited, UK) | 1 |
| SPECIAL BLACK 250 (Degussa, Germany) | 5 |

The mixture was applied to a polymeric surface of a printing cylinder to a wet thickness of approximately 3 μ and then was irradiated by UV lamp, which emits mainly in the UV region. The layer was then imaged with infrared imaging system.

EXAMPLE II

Direct Imaging Layer

This is an example illustrating the production of the formulation for a direct imaging layer. The following formulation was prepared as a mixture (the percentages are by weight of the entire formulation).

| Name | Producer | % |
|---|---|---|
| Methylen chloride | Aldrich Sigma | 50 |
| UV 9500 | GE Bayer silicones | 47 |
| UV 9380c | GE Bayer silicones | 1.5 |
| Dye Green 471151 | Aldrich-Sigma | 1.5 |

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for preparing printing member comprising:
   coating a printing cylinder with a layer comprising at least one ultravioler-curable silicone, and
   curing said layer using ultraviolet radiation;
   wherein said layer further comprises at least one photo-initiator, at least one photo-sensitizer and at least one infrared absorbing material.

2. A method for preparing a printing member comprising:
   coating a printing cylinder with a layer comprising at least one ultraviolet-curable silicone; and
   curing said layer using ultraviolet radiation;
   wherein said layer further comprises at least one vinyl ether.

3. A method comprising:
   coating a printing cylinder having a first layer thereon with a second layer comprising at least one ultraviolet-curable silicone and at least one infrared absorbing material; and
   curing said second layer using ultraviolet radiation.

4. The method of claim 3, wherein said coating and said curing are performed concurrently.

5. The method of claim 3 further comprising:
   curing said first layer prior to coating said second layer.

6. The method of claim 3, wherein said first layer is at least partially water-soluble.

7. The method of claim 3, wherein said first layer is water sensitive.

8. The method of claim 3, wherein said first layer comprise at least one ultraviolet-curable acrylate with low resistance to aqueous solutions.

9. The method of claim 8, wherein said at least one acrylate comprises polyether acrylates.

10. The method of claim 8, wherein said at least one acrylate comprises polyethylene glycol.

11. The method of claim 8, wherein said at least one acrylate comprises at least one acrylate with high acid value.

12. The method of claim 3, wherein said second layer further comprises at least one photo-initiator and at least one photo-sensitizer.

13. The method of claim 3, wherein said second layer further comprises at least one vinyl ether.

14. A method comprising:

coating a cylinder surface with a layer comprising at least one ultraviolet-curable silicone;

selectively imaging said layer by applying any one of visible and ultraviolet radiation to form imaged areas and non-imaged areas thereon; and subsequently removing said layer from said non-imaged areas.

15. A method for promoting adhesion of a coating to a printing cylinder, wherein said coating is coated on-press; comprising:

irradiating said printing cylinder with ultraviolet radiation prior to said coating.

* * * * *